United States Patent
Noh et al.

(10) Patent No.: US 10,032,980 B2
(45) Date of Patent: Jul. 24, 2018

(54) INTEGRATED CIRCUITS WITH MAGNETIC TUNNEL JUNCTIONS AND METHODS FOR PRODUCING THE SAME

(71) Applicant: Globalfoundries Singapore Pte. Ltd., Singapore (SG)

(72) Inventors: Seungmo Noh, Singapore (SG); Kazutaka Yamane, Singapore (SG); Kangho Lee, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/443,799

(22) Filed: Feb. 27, 2017

(65) Prior Publication Data

US 2017/0345999 A1 Nov. 30, 2017

Related U.S. Application Data

(60) Provisional application No. 62/327,993, filed on Apr. 26, 2016.

(51) Int. Cl.
| | |
|---|---|
| H01L 43/10 | (2006.01) |
| H01L 27/22 | (2006.01) |
| H01L 43/08 | (2006.01) |
| H01L 43/12 | (2006.01) |
| H01F 10/14 | (2006.01) |
| H01F 10/16 | (2006.01) |
| H01F 10/32 | (2006.01) |
| H01F 41/32 | (2006.01) |

(52) U.S. Cl.
CPC .......... *H01L 43/10* (2013.01); *H01F 10/145* (2013.01); *H01F 10/16* (2013.01); *H01F 10/3213* (2013.01); *H01F 41/32* (2013.01); *H01L 27/228* (2013.01); *H01L 43/08* (2013.01); *H01L 43/12* (2013.01)

(58) Field of Classification Search
None
See application file for complete search history.

(56) References Cited

U.S. PATENT DOCUMENTS

| | | | | |
|---|---|---|---|---|
| 2009/0015969 A1* | 1/2009 | Kainuma | ............... | B82Y 10/00 360/314 |
| 2014/0021568 A1* | 1/2014 | Choi | .................. | G11C 11/16 257/421 |
| 2017/0040529 A1* | 2/2017 | Pi | ....................... | H01L 43/10 |
| 2017/0177514 A1* | 6/2017 | Lee | ..................... | G06F 13/1668 |
| 2017/0294575 A1* | 10/2017 | Hu | ........................ | H01L 43/10 |

* cited by examiner

*Primary Examiner* — Long Pham
(74) *Attorney, Agent, or Firm* — Lorenz & Kopf, LLP

(57) ABSTRACT

Integrated circuits and methods of producing the same are provided. In an exemplary embodiment, an integrated circuit includes a magnetic tunnel junction with a fixed layer, a total free structure, and a barrier layer between the fixed layer and the total free structure. The total free structure includes a first free layer, a second free layer, and a first spacer layer disposed between the first and second free layers. The first spacer layer is non-magnetic. At least one of the first or second free layers include a primary free layer alloy with cobalt, iron, boron, and a free layer additional element. The free layer additional element is present at from about 1 to about 10 atomic percent. The free layer additional element is selected from one or more of molybdenum, aluminum, germanium, tungsten, vanadium, niobium, tantalum, zirconium, manganese, titanium, chromium, silicon, and hafnium.

12 Claims, 4 Drawing Sheets

INTEGRATED CIRCUITS WITH MAGNETIC TUNNEL JUNCTIONS AND METHODS FOR PRODUCING THE SAME

TECHNICAL FIELD

The technical field generally relates to integrated circuits with magnetic tunnel junctions (MTJs) and methods of producing the same, and more particularly relates to integrated circuits with MTJs having reduced switching currents and methods of producing the same.

BACKGROUND

Magnetoresistive Random Access Memory (MRAM) is an emerging technology that may be competitive with prior integrated circuit memory technologies, such as floating gate technology. The MRAM technology may integrate silicon-based electronic components with magnetic tunnel junction technology. A significant element in MRAM is the magnetic tunnel junction (MTJ) where information may be stored. The MTJ stack has at least two magnetic layers separated by a non-magnetic barrier, where a fixed layer has a set magnetic property and a free layer has a programmable magnetic property for storing information. If the fixed layer and the free layer have parallel magnetic poles, the resistance through the MTJ stack is measurably less than if the fixed layer and the free layer have anti-parallel poles, so parallel magnetic poles may be read as a "0" and anti-parallel poles may be read as a "1." The MTJ stack is typically incorporated into a memory cell, and many memory cells with MTJ stacks art incorporated into a memory bank.

The magnetic properties of the free layer are changed when the memory cell is programmed, where the alignment of the free layer magnetic properties is changed relative to the fixed layer magnetic properties in the programming process. Programming changes the magnetic properties of the free layer and the fixed layer from anti-parallel to parallel, or from parallel to anti-parallel. The programming process typically includes applying a charge across the MTJ stack such that a programming current passes through the MTJ stack. Reductions in the current required to program the MTJ stack improve the overall efficiency of the integrated circuit. The free layer of the MTJ stack has a perpendicular magnetic anisotropy (PMA) value, and higher PMA values decrease the required current to program the free layer. Higher PMA values also produce a lower damping constant, where a lower damping constant is also associated with a reduced current required for programming.

The stability of the permanent magnetic pole in the free magnetic layer degrades as the temperature increases, and the free layer may become demagnetized if the temperature exceeds the Curie temperature for the magnetic material in the free magnetic layer. A demagnetized free layer no longer retains the stored information. Thermal stability of the MTJ stack is related to an energy barrier of the MTJ stack, where higher energy barriers provide greater thermal stability. An energy barrier of the free layer should be sufficiently high to maintain thermal stability at packaging reflow process temperatures and/or at operating temperatures. Changes that increase the PMA values should not reduce the energy barrier to a point where the thermal stability of the free layer is compromised at process or operating temperatures.

Accordingly, it is desirable to provide integrated circuits with magnetic tunnel junctions having higher PMA values and reduced current requirements for reprogramming, as compared to traditional magnetic tunnel junctions, and methods for producing the same. In addition, it is desirable to provide integrated circuits with magnetic tunnel junctions that remain thermally stable as PMA values increase, and methods of producing the same. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods of producing the same are provided. In an exemplary embodiment, an integrated circuit includes a magnetic tunnel junction with a fixed layer, a total free structure, and a barrier layer between the fixed layer and the total free structure. The total free structure includes a first free layer, a second free layer, and a first spacer layer disposed between the first and second free layers. The first spacer layer is non-magnetic. At least one of the first or second free layers include a primary free layer alloy with cobalt, iron, boron, and a free layer additional element. The free layer additional element is present at from about 1 to about 10 atomic percent, based on a total weight of the primary free layer alloy. The free layer additional element is selected from one or more of molybdenum, aluminum, germanium, tungsten, vanadium, niobium, tantalum, zirconium, manganese, titanium, chromium, silicon, and hafnium.

An integrated circuit is provided in another embodiment. The integrated circuit includes a magnetic tunnel junction with a fixed layer, a total free structure, and a barrier layer between the fixed layer and the total free structure. The total free structure includes a first free layer, a second free layer, and a first spacer layer between the first and second free layers. The first spacer layer is non-magnetic and the first and second free layers are magnetic. At least one of the first or second free layers include a primary free layer alloy that includes cobalt, iron, boron, and a free layer additional element that is non-magnetic, based on a total weight of the primary free layer alloy.

A method of producing an integrated circuit is provided in yet another embodiment. The method includes forming a fixed layer that is magnetic, and forming a barrier layer that is non-magnetic overlying the fixed layer. A total free structure is formed overlying the barrier layer, where the total free structure includes a magnetic first free layer, a non-magnetic first spacer layer overlying the first free layer, and a magnetic second free layer overlying the first spacer layer. At least one of the first or second free layers include a primary free layer alloy that includes cobalt, iron, boron and a free layer additional element. The free layer additional element is present in the primary free layer alloy at from about 1 to about 10 atomic percent, based on a total weight of the primary free layer alloy, and includes one or more of molybdenum, aluminum, germanium, tungsten, vanadium, niobium, tantalum, zirconium, manganese, titanium, chromium, silicon, and hafnium.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

An integrated circuit includes a magnetic tunnel junction stack with a total free structure, where the total free structure includes a magnetic first free layer and a magnetic second free layer separated by a non-magnetic first spacer layer. At least one of the first free layer or the second free layer includes an alloy, where the alloy includes chromium, iron, boron, and a free layer additional element that is non-magnetic. The free layer additional element increases the perpendicular magnetic anisotropy (PMA) value, so the current required to program the total free structure is reduced compared to a total free structure that does not include the non-magnetic free layer additional element. The free layer additional element does not reduce the energy barrier such that the total free structure remains thermally stable at process or operating temperatures.

Figure 1:
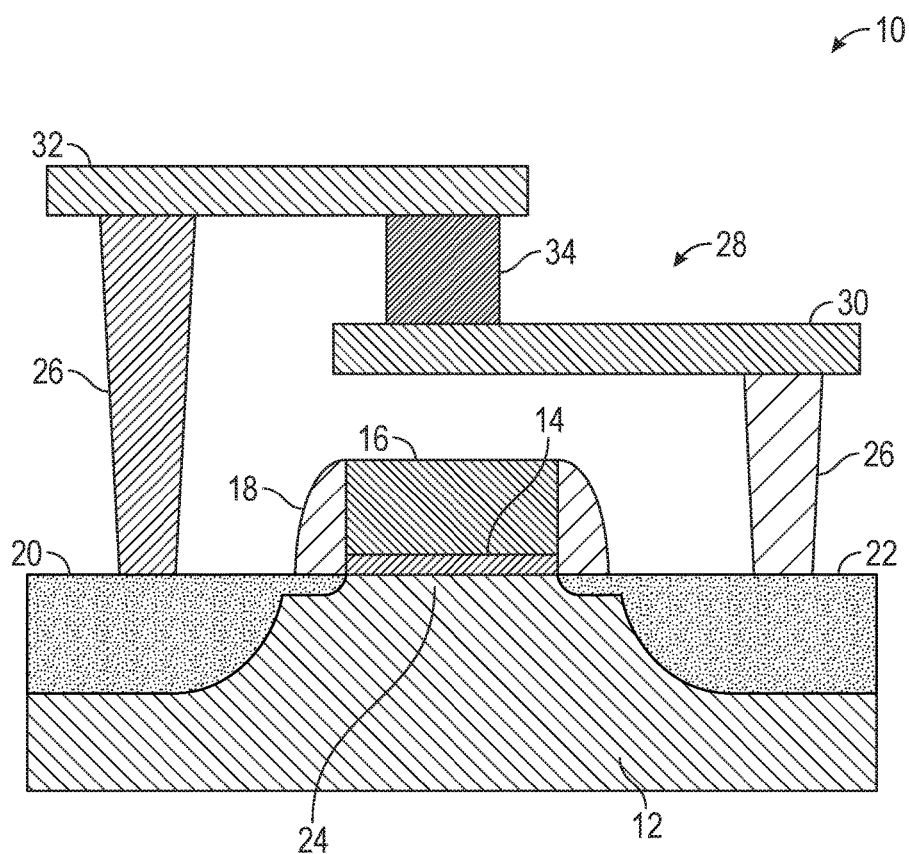
FIGS. 1 and 2 illustrate, in cross sectional views, an integrated circuit in accordance with exemplary embodiments.

Referring to an exemplary embodiment illustrated in FIG. 1, an integrated circuit 10 includes a substrate 12 formed of a semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least about 1 weight percent or more based on the total weight of the material unless otherwise indicated. In many embodiments, the substrate 12 primarily includes a monocrystalline semiconductor material. The substrate 12 may be a bulk silicon wafer (as illustrated) or may be a thin layer of silicon on an insulating layer (commonly known as silicon-on-insulator or SOI, not illustrated) that, in turn, is supported by a carrier wafer. The substrate 12 has a substrate surface, and the substrate surface may be used as a reference for various components described herein.

A gate insulator 14 overlies the substrate 12, and a gate 16 overlies the gate insulator 14. As used herein, the term "overlying" means "over" such that an intervening layer may lie between the gate insulator 14 and the substrate 12, or "on" such that the gate insulator 14 physically contacts the substrate 12. In an exemplary embodiment, the gate insulator 14 includes an electrically insulating material and the gate 16 includes an electrically conductive material. As used herein, an "electrically insulating material" is a material with a resistivity of about $1 \times 10^4$ ohm meters or more, an "electrically conductive material" is a material with a resistivity of about $1 \times 10^{-4}$ ohm meters or less, and an "electrically semiconductive material" is a material with a resistivity of from about more than $1 \times 10^{-4}$ ohm meters to less than about $1 \times 10^4$ ohm meters. For example, the gate insulator 14 may include silicon dioxide and the gate 16 may include polysilicon doped with conductivity determining impurities, but other materials may be used in alternate embodiments. Electrically insulating spacers 18 may overlie the substrate 12 adjacent to the gate insulator 14 and the gate 16, where spacers 18 are positioned on opposite sides of the gate insulator 14 and the gate 16. The spacers 18 may include silicon dioxide, silicon nitride, or other electrically insulating materials in various embodiments. A source 20 may be formed within the substrate 12 on one side of the gate 16, and a drain 22 may be formed within the substrate 12 on the opposite side of the gate 16. The source 20 and drain 22 include conductivity determining impurities (sometimes referred to as "dopants") at a higher concentration than in the substrate 12. FIG. 1 illustrates a planar transistor 28, where the transistor 28 includes the gate insulator 14, the gate 16, the spacers 18, the source 20, the drain 22, and a channel 24 disposed within the substrate 12 between the source 20 and drain 22 and underlying the gate 16. However, finned field effect transistors (not illustrated), transistors with the source and drain formed overlying the substrate (not illustrated), or other types of transistors 28 may be used in alternate embodiments.

In the illustrated embodiment, a bottom electrode 30 is in electrical communication with the drain 22, and a top electrode 32 is in electrical communication with the source 20. A contact 26 may be used to electrically connect the source 20 and drain 22 with the top and bottom electrodes 32, 30, respectively. The term "electrical communication," as used herein, means electrical current is capable of flowing from one component to another, where the electrical current may or may not flow through an electrically conductive or semiconductive intervening component. The term "direct electrical contact," as used herein, means direct physical contact between components that are electrically conductive or semiconductive, but not electrically insulating. A magnetic tunnel junction stack 34 (MTJ stack) is positioned between the bottom and top electrodes 30, 32, where the MTJ stack 34 is in electrical communication with the bottom and top electrodes 30, 32. In an exemplary embodiment, the bottom electrode 30 may serve as a word line, and the top electrode 32 may serve as a bit line, but other embodiments are also possible. The bottom and top electrodes 30, 32 may include several layers (not illustrated,) such as a seed layer, a core, and a cover, and may include tantalum, tantalum nitride, nickel, copper, aluminum, or other electrically conductive materials. The MTJ stack 34 and the bottom and top electrodes 30, 32 may also be connected to other electronic components instead of the transistor 28, or in addition to the transistor 28 in various embodiments.

Figure 2:
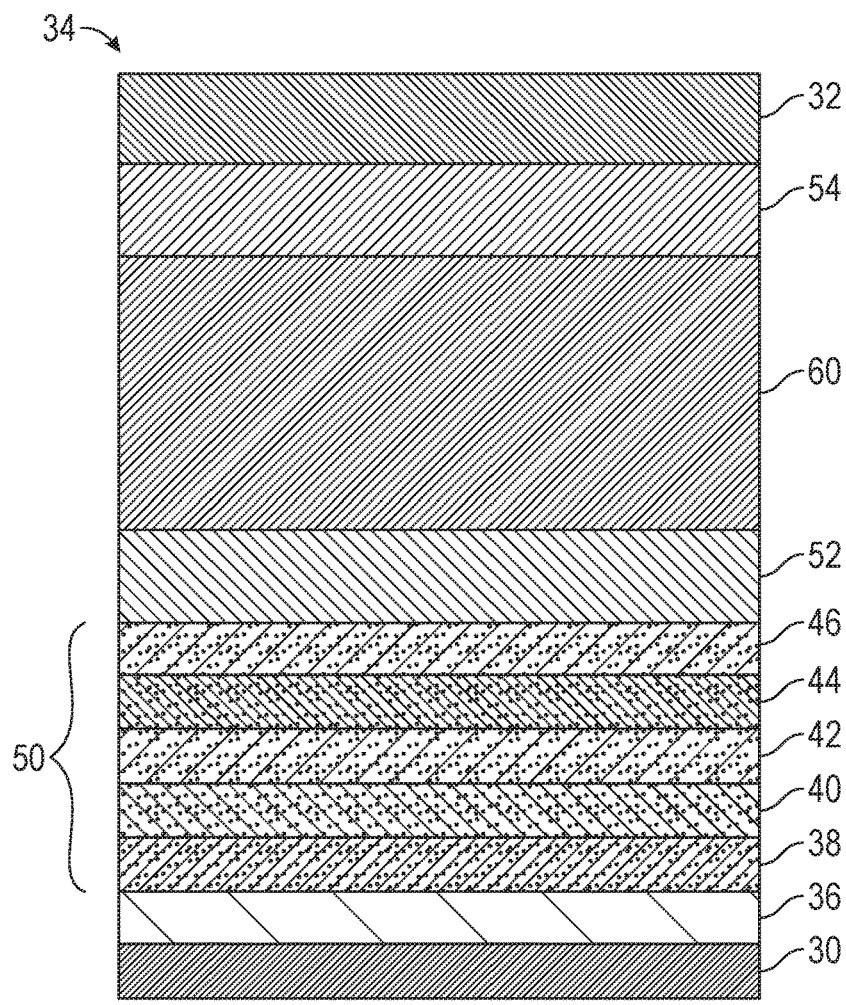

An embodiment of the MTJ stack 34 is illustrated in greater detail in FIG. 2. The MTJ stack 34 includes several layers overlying each other, where the illustrated layers may include sub-layers in some embodiments and where additional layers may also be present. In an exemplary embodiment, a seed layer 36 overlies the bottom electrode 30, a second hard metal layer 38 overlies the seed layer 36, a fixed divider layer 40 overlies the second hard metal layer 38, a first hard metal layer 42 overlies the fixed divider layer 40, a transition layer 44 overlies the first hard metal layer 42, and a reference layer 46 overlies the transition layer 44. In the illustrated embodiment, a fixed layer 50 includes the second hard metal layer 38, the fixed divider layer 40, the first hard metal layer 42, the transition layer 44, and the reference layer 46. The first and second hard metal layers 42, 38 are magnetic, and the fixed divider layer 40 is non-magnetic. As used herein, a layer or material is "magnetic" if it is a ferromagnetic material, where the term "ferromagnetic" does not require the presence of iron. More particularly, a material is "magnetic" if it is a permanent magnet that retains its magnetic field after an induction magnetic field is removed, where the permanent magnet has a residual flux density of about 0.1 tesla or more. A layer or material is "non-magnetic" if it is a diamagnetic or a paramagnetic material, and more particularly does not form a permanent magnet or is only capable of forming a permanent magnet that has a residual flux density of less than about 0.1 tesla or less. A "permanent" magnet is a magnet that has residual flux density of about 0.1 tesla or more for at least about 1 week or more after being removed from an induction magnetic field. The transition layer 44 is nonmagnetic and the reference layer 46 is magnetic in an exemplary embodiment.

In an exemplary embodiment, the seed layer 36 includes two or more of nickel, chromium, ruthenium, and platinum, and may also include other materials; the first and second hard metal layers 42, 38 include cobalt platinum compounds, cobalt nickel compounds, cobalt iron compounds, manganese platinum compounds, or other materials; the fixed divider layer 40 primarily includes one or more of ruthenium, iridium, rhodium, chromium, or nickel; the transition layer 44 primarily includes one or more of tantalum, tungsten, or molybdenum; and the reference layer 46 primarily includes cobalt, iron, and boron. However, other materials may be used in alternate embodiments. In an exemplary embodiment, the seed layer 36, the first and second hard metal layers 42, 38, the fixed divider layer 40, the transition layer 44 and the reference layer 46 are formed by sputtering or by ion beam deposition using the materials of the various layers, but other deposition techniques may also be used. The first and second hard metal layers 42, 38 may have the same composition as each other or may have compositions that vary from each other in various embodiments.

A tunnel barrier layer 52 is formed overlying the fixed layer 50, where the tunnel barrier layer 52 includes magnesium oxide in an exemplary embodiment. The tunnel barrier layer 52 and the remaining layers in the MTJ stack 34 may be formed by sputtering, by ion beam deposition, or by other techniques in various embodiments. A total free structure 60 overlies the tunnel barrier layer 52, a capping layer 54 overlies the total free structure 60, and the top electrode 32 overlies the capping layer 54. An additional tunnel barrier layer (not illustrated) or other layers may also be included in the MTJ stack 34 in various embodiments. The capping layer 56 is a nonmagnetic layer that may include ruthenium, hafnium, molybdenum, tungsten, platinum, nickel, or other compounds.

Figure 3:
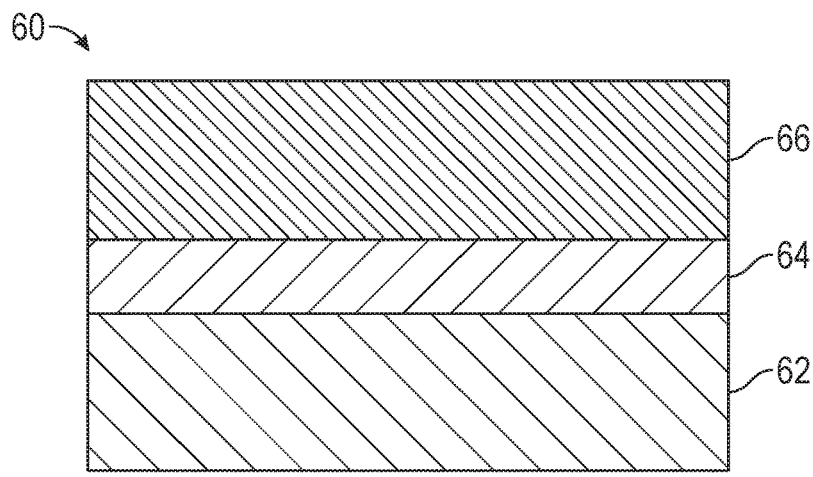
FIGS. 3-6 illustrate, in cross sectional views, various embodiments of a magnetic tunnel junction of an integrated circuit, and methods for fabricating the same.

The total free structure 60 includes a plurality of individual free layers separated by spacer layers, as illustrated in an exemplary embodiment in FIG. 3 with continuing reference to FIG. 2. In the illustrated embodiment, the total free structure 60 includes a first free layer 62 that is a magnetic layer, and a first spacer layer 64 overlying the first free layer 62, where the first spacer layer 64 is nonmagnetic. A second free layer 66 overlies the first spacer layer 64, where the second free layer 66 is a magnetic layer. At least one of the first free layer 62 or the second free layer 66 is formed of a primary free layer alloy that includes cobalt, nickel, boron, and a free layer additional element. An "alloy," as used herein, means a mixture of at least one metal and another element with a metallic bonding character, where each element listed in the alloy is mixed with all the other elements in the alloy as opposed to being a separate layer. An alloy may have a concentration gradient in some embodiments, where the concentration of one component that is mixed within the alloy is higher at one location than at another location, but the alloy may have a constant concentration profile for all element present in some embodiments. In an exemplary embodiment, the primary free layer alloy includes cobalt, nickel, boron, and the free layer additional element at a total concentration of about 100 atomic percent, but the primary free layer alloy may also include one or more other elements in some embodiments.

The free layer additional element is a non-magnetic material, and may be one or more of molybdenum (Mo), aluminum (Al), germanium (Ge), tungsten (W), vanadium (V), niobium (Nb), tantalum (Ta), zirconium (Zr), manganese (Mn), titanium (Ti), chromium (Cr), silicon (Si), and hafnium (Hf). The free layer additional element is present in the primary free layer alloy at a concentration of from about 1 atomic percent to about 10 atomic percent, based on a total weight of the primary free layer alloy. The free layer additional element is present in the primary free layer alloy at a low enough concentration that the first and/or second free layers 62, 66 are magnetic despite the presence of the non-magnetic free layer additional element. It has been found that the inclusion of the non-magnetic free layer additional element increases the perpendicular magnetic anisotropy (PMA) of the primary free layer alloy, which lowers the current required to program the total free structure 60 relative to a total free structure 60 with individual free layers that do not include the free layer additional element.

The primary free layer alloy includes the free layer additional element at a relatively low concentration. This hinders forming a total free structure 60 that includes the free layer additional element in a relatively pure form, such as in a layer separate from other layers with cobalt, iron, and/or boron. If the free layer additional element were to be formed in a separate layer, the thickness of that layer may result in a pure layer of the free layer additional element that is too thin for practical production processes because of the small amount of the free layer additional material needed to produce an effective concentration of the free layer additional element at from about 1 to about 10 atomic percent when combined with a magnetic layer. As such, the alloying of the non-magnetic free layer additional element with the listed magnetic materials (cobalt, iron, and boron) allows for incorporation of low levels of the free layer additional element to facilitate fine tuning of the magnetic properties of the total free structure 60. In an alternate embodiment, the free layer additional element is one or more of Mo, W, Nb, Ta, Zr, Mn, Ti, Si, and Hf. In yet another embodiment, the free layer additional element is Mo. The primary free layer alloy includes cobalt, iron, boron, and the free layer additional element at about 1 to about 10 atomic percent, as described above. In many embodiments, the listed atomic percents correspond to the free layer additional element being present in the primary free layer alloy at about 0.5 weight percent to about 30 weight percent, as can be determined by reviewing the atomic weights of the elements described above.

The first spacer layer 64 (and other spacer layers that may be present in the total free structure 60 as described below) include a non-magnetic material such that the first spacer layer 64 (and other spacer layers in the total free structure 60) are non-magnetic. In an exemplary embodiment, the first spacer layer 64 (and other spacers layers within the total free structure 60) include one or more of titanium (Ti), vanadium (V), chromium (Cr), zirconium (Zr), niobium (Nb), molybdenum (Mo), hafnium (Hf), tantalum (Ta), tungsten (W), and aluminum (Al), where these elements may be present at from about 1 to about 100 atomic percent.

At least one of the first or second free layers 62, 66 includes the primary free layer alloy, as described above. The other of the first and second free layers 62, 66 may include several different compositions, where "different compositions" means different elements are present, or the same elements are present but at different concentrations. For example, the other of the first and second free layer 62 may include an alloy of: (i) cobalt and iron at a concentration of about 100 atomic percent; (ii) cobalt, iron, and boron at a concentration of about 100 atomic percent; (iii) a secondary free layer alloy that includes cobalt, iron, boron, and the additional free layer element at concentrations different than those in the primary free layer alloy; or (iv) other compositions that produce a magnetic material, with all concentrations based on the total weight of the referenced layer. In this disclosure, references to a component having a concentration of about 100 atomic percent may be indicated by saying the composition "consists" of listed components, where the listed components are present at about 100 atomic percent based on the total weight of the component. The second free layer alloy may include cobalt, iron, boron, and the additional free layer element at a total concentration of about 100 atomic percent in some embodiments, but the second free layer alloy may include one or more additional elements in some embodiments.

Figure 4:
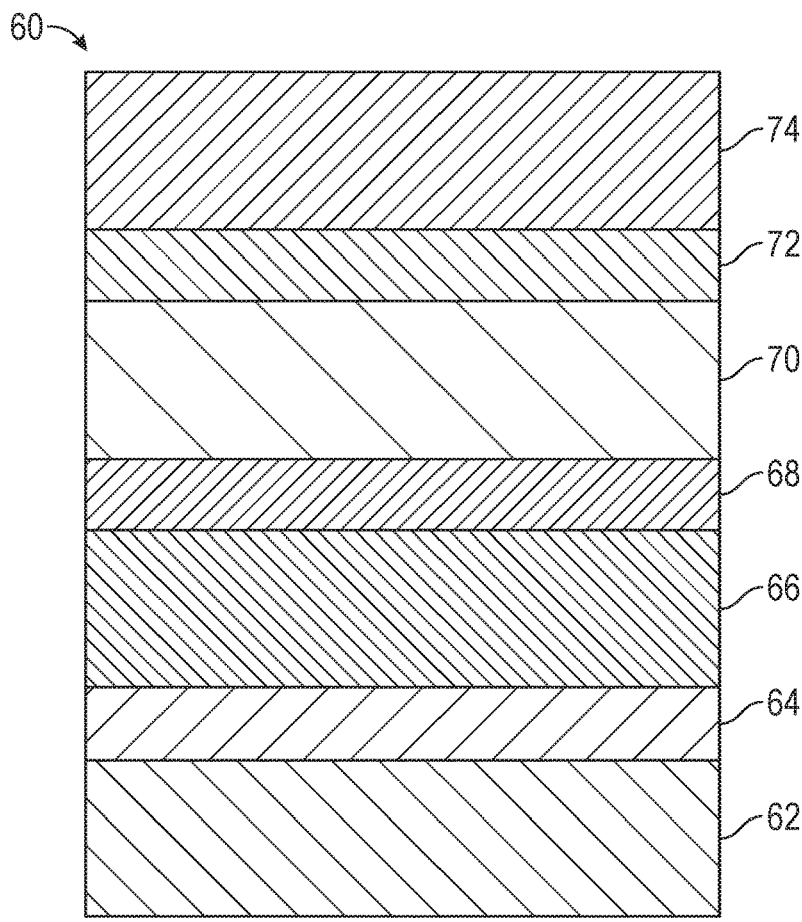

The total free structure 60 may include a total of two individual free layers in some embodiments, as described above. However, the total free structure 60 may include additional layers in alternate embodiments. One such embodiment is illustrated in FIG. 4. The embodiment illustrated in FIG. 4 includes the first and second free layer 62, 66, but also includes other layers. The additional layers in FIG. 4 include a non-magnetic second spacer layer 68 overlying the second free layer 66, a magnetic third free layer 70 overlying the second spacer layer 68, a non-magnetic third spacer layer 72 overlying the third free layer 70, and a magnetic fourth free layer 74 overlying the third spacer layer 72. However, there may be a total of two, three, four, or more individual free layers in alternate embodiments, where an individual non-magnetic spacer layer is positioned between each of the plurality of individual free layers. All the individual free layers are magnetic, and all the individual spacer layers are nonmagnetic. All the individual free layers 62, 66, 70, 74 may include an alloy with cobalt and iron, and some or all of the individual free layers 62, 66, 70, 74 may also include additional elements, such as those described above.

Figure 5:
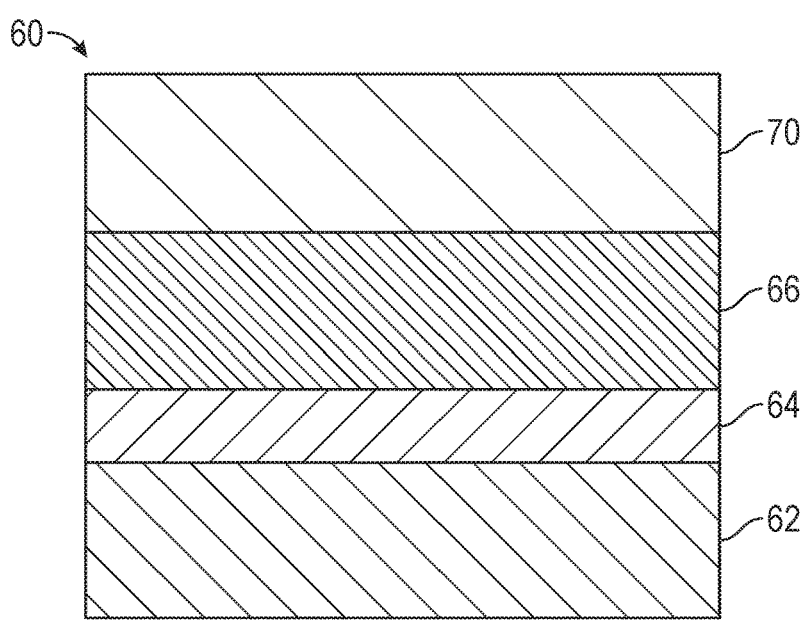

Another possible embodiment is illustrated in FIG. 5, where the first and second free layers 62, 66 and separated by the first spacer layer 64. The third free layer 70 directly contacts one of the first or second free layers 62, 66, with no spacer layer between the third free layer 70 and either the first or second free layer 62, 66. In the illustrated embodiment, the third free layer 70 directly contacts and overlies the second free layer 66, but other possibilities are possible. The third free layer 70 may (i) directly contact and underlie the first free layer 62; (ii) directly contact and overlie the first free layer 62 such that the third free layer 70 is between the first free layer 62 and the first spacer layer 64; or (iii) directly contact and underlie the second free layer 66 such that the third free layer 70 is between the second free layer 66 and the first spacer layer 64. Different free layers that directly contact each other can be differentiated by composition, where different free layers in direct contact have different compositions from each other.

Figure 6:
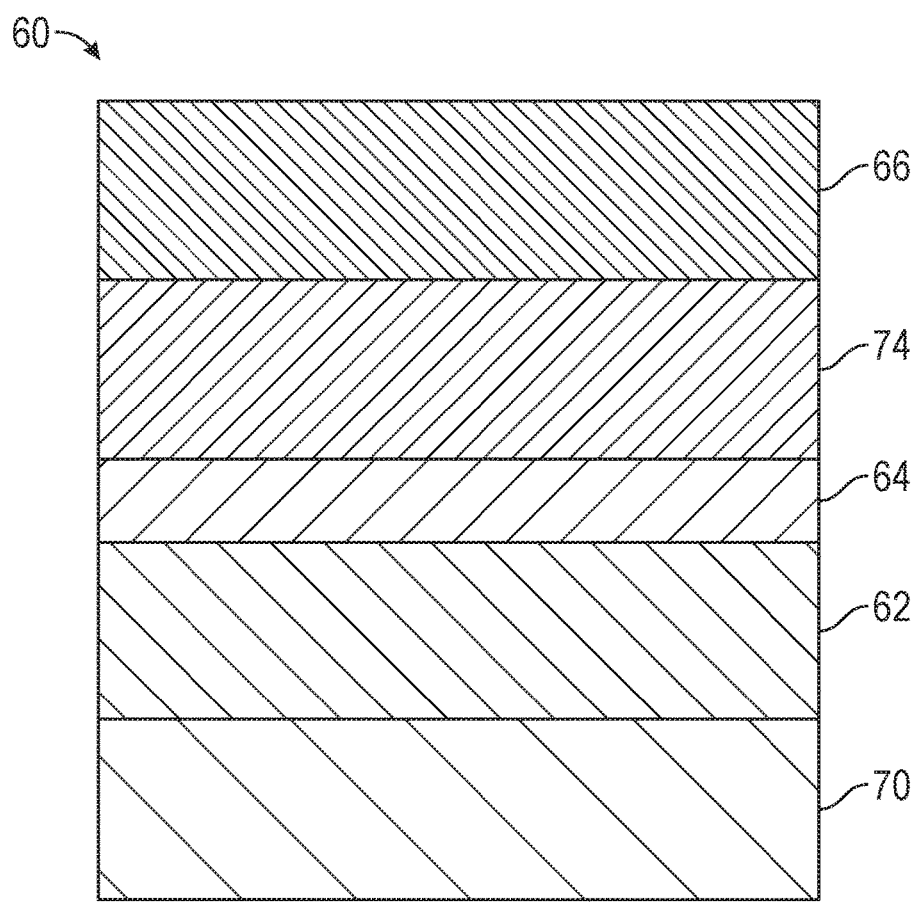

Another possible embodiment is illustrated in FIG. 6, where the total free structure 60 includes the fourth free layer 74. In the illustrated embodiment, the third and fourth free layers 70, 74 directly contact the first and/or second free layers 62, 66. The fourth free layer 74 may directly contact any of the first, second, and/or third free layers 62, 66, 70, and/or the first spacer layer 64 or other spacer layers. In some embodiments, each of the first, second, third and fourth free layers 62, 66, 70, 74 (if present) have different compositions. In alternate embodiments, one or more of the first, second, third, and fourth free layers 62, 66, 70, 74 may have the same composition, so many variations are possible. For example, one of the first and second free layers 62, 66 may include cobalt and iron for a total of about 100 atomic percent, the other of the first and second free layer 62, 66 may include the primary free layer alloy, the third free layer 70 may include: (i) an alloy of cobalt, iron, and boron at a total of about 100 atomic percent; (ii) a tertiary free layer alloy of cobalt, iron, boron and the free layer additional element, at a total atomic percent of about 100, where the concentration of the components in the tertiary free layer alloy is different than that in the primary free layer alloy; or (iii) other compositions that produce a magnetic material.

The MTJ stack 34 may be patterned into a desired shape for use as a memory cell (not illustrated) using photolithography and a reactive ion etch techniques. The patterned MTJ stack 34 may then be further incorporated into an integrated circuit 10 in a wide variety of manners. In an exemplary embodiment, the MTJ stack 34 is incorporated into a memory cell (not illustrated), and that memory cell is further incorporated into a memory bank (not illustrated).

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. An integrated circuit comprising:
a magnetic tunnel junction comprising a fixed layer, a total free structure, and a barrier layer positioned between the fixed layer and the total free structure, wherein the total free structure comprises a first free layer, a second free layer, and a first spacer layer, wherein the first spacer layer is non-magnetic, wherein the first spacer layer is disposed between the first free layer and the second free layer, wherein at least one of the first free layer or the second free layer comprise a primary free layer alloy, wherein the primary free layer alloy comprises an alloy of cobalt, iron, boron, and a free layer additional element, wherein the free layer additional element is present at a concentration of from about 1 atomic percent to about 10 atomic percent, based on a total weight of the primary free layer alloy, and wherein the free layer additional element is selected from one or more of niobium (Nb) and hafnium (Hf).

2. The integrated circuit of claim 1 wherein the free layer additional element is Nb.

3. The integrated circuit of claim 1 wherein the free layer additional element is Hf.

4. The integrated circuit of claim 1 wherein the first spacer layer comprises a non-magnetic material selected from one or more of titanium (Ti), vanadium (V), chromium (Cr), zirconium (Zr), niobium (Nb), molybdenum (Mo), hafnium (Hf), tantalum (Ta), tungsten (W), and aluminum (Al).

5. The integrated circuit of claim 1 wherein the total free structure comprises a third free layer, wherein the third free layer directly contacts one of the first free layer or the second free layer.

6. The integrated circuit of claim 5 wherein one of the first free layer and the second free layer consists of iron and cobalt.

7. The integrated circuit of claim 5 wherein the first free layer, the second free layer, and the third free layer all have different compositions.

8. The integrated circuit of claim 5 wherein the third free layer comprises about 100 percent of a tertiary free layer alloy, wherein the tertiary free layer alloy is an alloy of cobalt, iron, boron, and the free layer additional element.

9. The integrated circuit of claim 8 wherein the tertiary free layer alloy has a different composition than the primary free layer alloy.

10. The integrated circuit of claim 1 wherein the magnetic tunnel junction further comprises:
a second spacer layer that is non-magnetic, wherein the second spacer layer overlies the second free layer;
a third free layer that is magnetic, wherein the third free layer overlies the second spacer layer.

11. The integrated circuit of claim 1 wherein one of the first free layer or the second free layer consists of an alloy of cobalt, iron, and boron.

12. The integrated circuit of claim 1 wherein one of the first free layer or the second free layer comprises an alloy of iron and cobalt at about 100 atomic percent.

* * * * *